United States Patent [19]

Noda et al.

[11] 4,336,872
[45] Jun. 29, 1982

[54] APPARATUS FOR TRANSFERRING PARTS OR THE LIKE

[75] Inventors: Teruyoshi Noda; Iwao Ichikawa; Toshio Takahashi, all of Tokyo, Japan

[73] Assignee: Sony Corporation, Tokyo, Japan

[21] Appl. No.: 145,720

[22] Filed: May 1, 1980

[30] Foreign Application Priority Data

May 10, 1979 [JP] Japan .................................. 54-57446

[51] Int. Cl.³ .............................................. B65G 11/00
[52] U.S. Cl. .................................... 193/2 R; 29/834; 193/30; 285/176; 138/DIG. 11
[58] Field of Search ................ 193/2 R, 25 FT, 25 S, 193/30; 406/191, 195, 196; 285/176; 138/177, DIG. 11; 29/834; 198/390

[56] References Cited

U.S. PATENT DOCUMENTS

| | | | |
|---|---|---|---|
| 373,540 | 11/1887 | Thayer | 193/2 R |
| 853,750 | 5/1907 | Whorrall | 285/176 X |
| 3,552,780 | 1/1971 | Warren | 285/176 |
| 3,599,768 | 8/1971 | Connolly | 193/25 FT |
| 3,751,297 | 8/1973 | Minbiole, Jr. et al. | 406/191 X |

FOREIGN PATENT DOCUMENTS

| | | | |
|---|---|---|---|
| 27623 | 5/1921 | Denmark | 285/176 |
| 4054 | 10/1880 | United Kingdom | 138/DIG. 11 |

Primary Examiner—Jeffrey V. Nase
Attorney, Agent, or Firm—Lewis H. Eslinger; Alvin Sinderbrand

[57] ABSTRACT

Leadless electronic parts or the like are transferred from hoppers under the influence of gravity or by forced air through tubes of polygonal cross-section to a prepositioning template. The polygonal cross sections of the transferring tubes tend to damp out oscillatory motion of the parts and to speed their travel through the tubes. Each polygonal, preferably triangular, tube is preferably obtained by deforming a tube of circular cross-section in a forming machine including a plurality of discs arranged so that their peripheries define a polygonal space therebetween through which the tube of circular cross section is driven.

1 Claim, 12 Drawing Figures

U.S. Patent  Jun. 29, 1982  Sheet 4 of 4  4,336,872
FIG.9
FIG.10
FIG.11
FIG.12
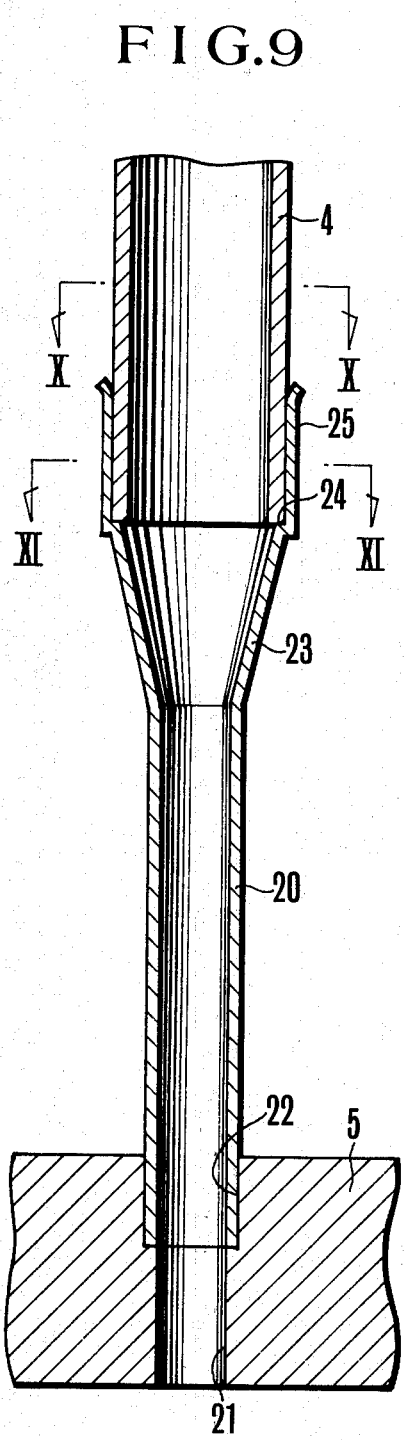
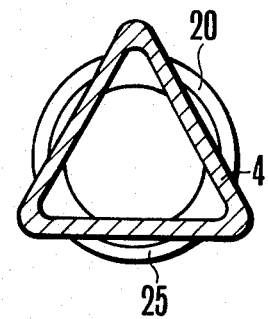
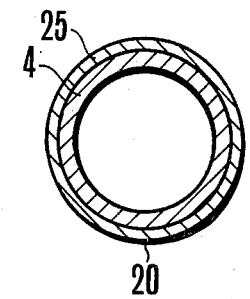

APPARATUS FOR TRANSFERRING PARTS OR THE LIKE

BACKGROUND OF THE INVENTION

1. Field of the Invention

This invention relates to an apparatus for transferring electronic parts or the like from hoppers to specific locations, and more particularly is directed to an apparatus for transferring chip-type circuit elements from hoppers to specific locations in a template by which the elements are pre-positioned for mounting on a printed circuit board or a hybrid integrated circuit.

2. Description of the Prior Art

Printed circuit boards are commonly used for the assembly of electronic circuits. A printed circuit board consists of an insulating substrate with a pattern of conductors printed on one or both sides thereof for interconnection of parts and for connection to external circuits. Conventional assembly methods include inserting wire leads of electronic components through holes or connecting them to posts for temporarily affixing them to the circuit board until a single conventional soldering operation mechanically and electrically connects the leads of the circuit board. The art of computer-controlled manual insertion of such conventional parts onto circuit boards with little or no hand labor is now well advanced.

Chip-type circuit elements are now employed to perform the functions of a number of active and/or passive elements in an electronic circuit, thereby to increase the circuit density and improve the reliability of the resulting circuit. Chip-type elements are usually formed as cylinders having end caps at the ends with terminals for direct soldering to conductors on the circuit board rather than the wire leads provided on the earlier conventional components. Such chip-type elements, being very small and lacking wire leads, resist automatic insertion in the circuit board by conventional automatic insertion machinery prior to attachment by the soldering operation.

Installing chip-type elements by manual placement of the chip-type circuit elements one-by-one at predetermined positions on the circuit board obviously involves unacceptably tedious and costly labor. Usually, the chip-type elements are temporarily secured to the circuit board using an adhesive resin until the soldering operation is completed.

In order to avoid the above objections to the manual placement of chip-type circuit elements, it has been proposed to feed the elements from hoppers through transferring tubes which convey them by gravity and/or by air under pressure to specific locations in a template which positions a set of the chip-type circuit elements in the relative translational and rotational orientations required for mounting a printed circuit board. The chip-type circuit elements can thereupon be temporarily affixed, as a set, at appropriate locations on a printed circuit board which has been previously prepared with a corresponding pattern of adhesive resin.

Transfer of the chip-type circuit elements from the hopper to the template has conventionally been performed with transferring tubes of circular cross-section. It has been found that the generally cylindrical chip-type circuit elements undergo rotational and vibrational motions while being transferred through such cylindrical transferring tubes. Such vibration and rotation decreases the speed of transfer of the elements by factors of 10 or 20 compared to the transferring speed which can be attained if the elements are prevented from vibrating and/or rotating. Thus, the transfer operation takes 10-20 times longer than would otherwise be required, and the reliability of the operation is degraded.

One measure that has been employed to prevent vibration of the chip-type circuit elements in travelling through the transferring tube is a tensioned wire passing down through the interior of the transferring tube to interfere with stable vibration and rotation of the chip-type circuit elements as they pass therethrough. Although usually effective to speed up the transfer of the circuit elements through the transferring tube, the provision of a wire in the transferring tube is expensive and it is difficult to control the tension thereof for proper damping of vibration of the chip-type circuit elements as they pass through the tube. Furthermore, the wire increases the tendency of the elements to choke the tube and block the transfer of elements therethrough.

OBJECTS AND SUMMARY OF THE INVENTION

Accordingly, it is an object of this invention to provide a transferring apparatus for chip-type circuit elements or the like which overcomes the foregoing drawbacks of the prior art.

It is another object of this invention to discourage vibration of chip-type circuit elements while being transferred in a transferring tube.

It is still another object of this invention to provide an apparatus for quickly transferring circuit elements through a transferring tube.

It is a further object of this invention to provide an apparatus for transferring circuit elements through a transferring tube while avoiding clogging of the circuit elements in the tube.

It is a still further object of this invention to provide an apparatus for transferring parts, as aforesaid, which has a simple structure and is inexpensive.

Yet another object of this invention is to provide an apparatus for forming a tube which is effective to rapidly transfer circuit elements therethrough.

According to an aspect of the invention, there is provided an apparatus for transferring parts from a first location to a second location comprising a transferring tube of polygonal cross-section having first and second ends, means at the first location for feeding the parts into the first end, and means at the second location for receiving the parts from the second end.

According to another aspect of the invention, there is provided an apparatus for forming a transferring tube of permanently deformable material for transferring parts from a first location to a second location comprising at least three discs each having a perimeter and an axis, the perimeters being mutually disposed to define a polygonal space at the nearest mutual approach of the perimeters to each other, means for driving at least one of the discs about the axis thereof, means for permitting the others of the at least three discs to rotate about the axes thereof, and the perimeters being effective to deform a tube of the permanently deformable material from a circular cross section to a polygonal cross section substantially matching the shape of the polygonal space.

The above, and other objects, features and advantages of the present invention, will become apparent from the following description of illustrative embodiments to be read in conjunction with the accompanying drawings in which like reference numerals designate like elements and parts.

BRIEF DESCRIPTION OF THE DRAWINGS

FIG. 9 is a longitudinal sectional view of a connecting portion between a transferring tube and a positioning plate;

FIG. 10 is a cross section taken along the line X—X on FIG. 9;

FIG. 11 is a cross section taken along the line XI—XI on FIG. 9; and

FIG. 12 is a perspective view showing the engagement of the transferring tube with the connecting portion of FIG. 9.

DETAILED DESCRIPTION OF THE PREFERRED EMBODIMENTS

Figure 1:
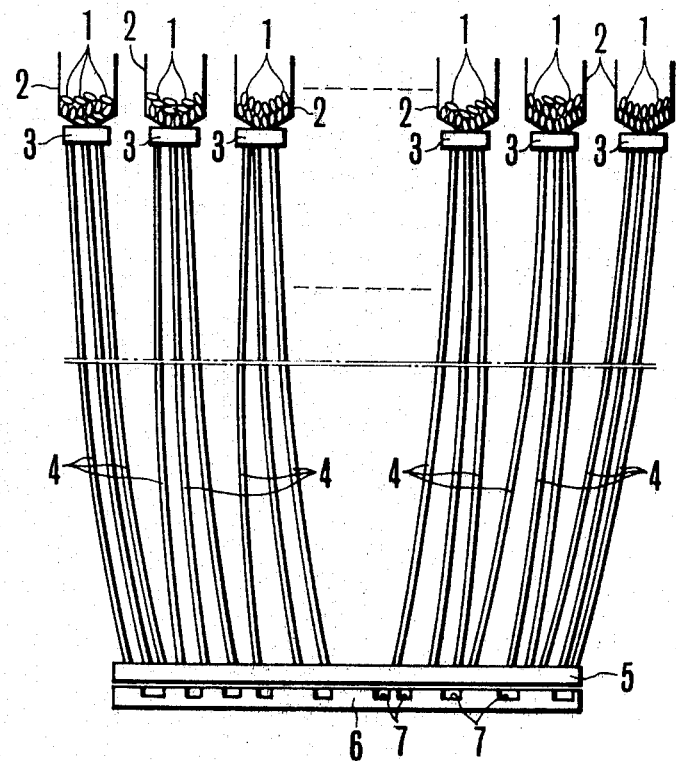
FIG. 1 is a schematic front elevational view of an apparatus for transferring chip-type circuit elements according to an embodiment of this invention.

Referring to FIG. 1, it will be seen that various leadless circuit elements 1, such as chip-type electric parts, are contained in a plurality of hoppers 2. Shutter mechanisms 3 control the feeding of circuit elements 1 from the respective hoppers 2 to the upper ends of individual transferring tubes 4. A positioning plate 5 holds the lower ends of transferring tubes 4 in proper locations to feed circuit elements from such transferring tubes 4 into respective recesses 7 in a template 6. In passing through positioning plate 5, the circuit elements may be laterally turned by well known means to properly orient them as they drop into recesses 7.

Transferring tubes 4 may be of any convenient material, but are preferably of polytetrafluoroethylene so as to present a desirably low frictional resistance to the passage of elements 1 therethrough.

Once circuit elements 1 are located in recesses 7 of template 6, they may be transferred as a unit to a printed circuit board (not shown) where they are temporarily adhered by an adhesive resin until permanently affixed to conductive patterns on the board by a soldering operation.

Circuit elements 1 may be carried through transferring tubes 4 by gravity, or the passage of circuit elements 1 through transferring tubes 4 may be effected or aided by a flow of air under pressure.

Figure 2:
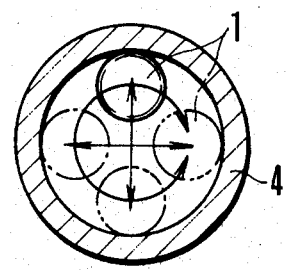
FIG. 2 is a transverse cross section of a transferring tube according to the prior art.
Figure 3:
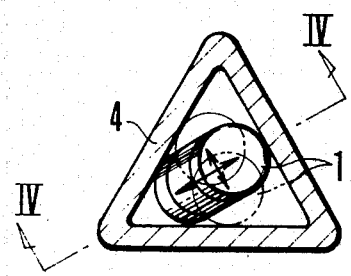
FIG. 3 is a transverse cross section similar to that of FIG. 2, but showing a transferring tube according to an embodiment of the invention.
Figure 4:
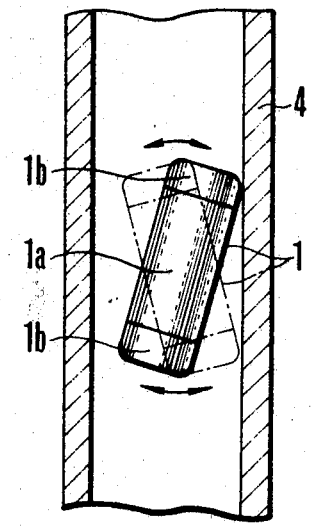
FIG. 4 is a sectional view taken along the line IV—IV on FIG. 3.

Referring now to FIGS. 3 and 4, it will be seen that chip-type circuit elements generally have a cylindrical body portion 1a with caps or electrode portions 1b at the opposite ends thereof. As such a circuit element 1 passes through a transferring tube 4 having a circular cross section according to the prior art, as shown on FIG. 2, circuit element 1 may spin about its own axis, the ends of the element 1 may orbit about the axis of transferring tube 4, as shown by the circular arrow, or the ends of element 1 may vibrate transversely across transferring tube 4, as shown by the crossed arrows on FIG. 2. The orbiting and transverse movements of the opposite ends 1b of element 1 may occur simultaneously or in opposite directions to cause the oscillatory motions shown in FIG. 4. The described motions of element 1 can be started by any shock or irregularity in tube 4 during the transfer of the element 1 therethrough, and, if the tube 4 has a circular cross-section, as in FIG. 2, such motions can stably continue while circuit element 1 passes along the length of transferring tube 4. Such stability arises due to the symmetry of transferring tube 4. While stably vibrating and oscillating in this manner, the speed of circuit element 1 is reduced by a factor of 10 or 20.

If the transferring tube 4 having a circular cross-section, as in FIG. 2, is replaced by a transferring tube 4 of triangular cross section, as shown in FIG. 3, the non-circular perimeter of triangular transferring tube 4 interferes with the rotational vibration or orbiting of ends 1b of circuit element and constrains such ends to move generally linearly, as shown by the crossed arrows on FIG. 3. Energies of oscillation and spin are absorbed by contact with the walls of triangular transferring tube 4 and such movements do not continue in a stable manner. As a result, circuit elements 1 are transferred with much less interference from transferring tube 4 and in a much shorter time.

To further improve the reduction of oscillation and spin, and thus further improve the speed of transfer, triangular transferring tube 4 may be twisted about its axis.

The triangular transferring tube 4 of FIG. 3 may be formed from a conventional cylindrical tube, such as shown in FIG. 2, by deforming the cylindrical tube into the desired triangular shape. Suitable dimensions for the cylindrical tube may be chosen to accommodate the dimensions of the circuit elements after deformation into a triangular cross section. For example, if chip-type circuit elements 1 have a body portion 1a of 2.2 mm (FIG. 4) and a diameter of a cap or electrode portion 1b of 2.5 mm, a circular tube having an external diameter of about 5 mm and an internal diameter of about 4 mm is satisfactory to produce a suitable triangular transferring tube 4.

Figure 5:
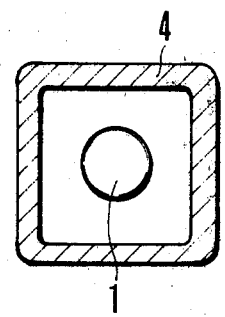
FIG. 5 is a cross section of a transferring tube according to another embodiment of the invention.

Although transferring tube 4 of FIG. 3 is shown with a cross section in the shape of an equilateral triangle, other triangular shapes, such as isosceles or scalene, may be substituted therefor. Furthermore, other polygonal cross sectional shapes such as, for example, the square cross-section shown in FIG. 5, may be employed for transferring tube 4.

Figure 6:
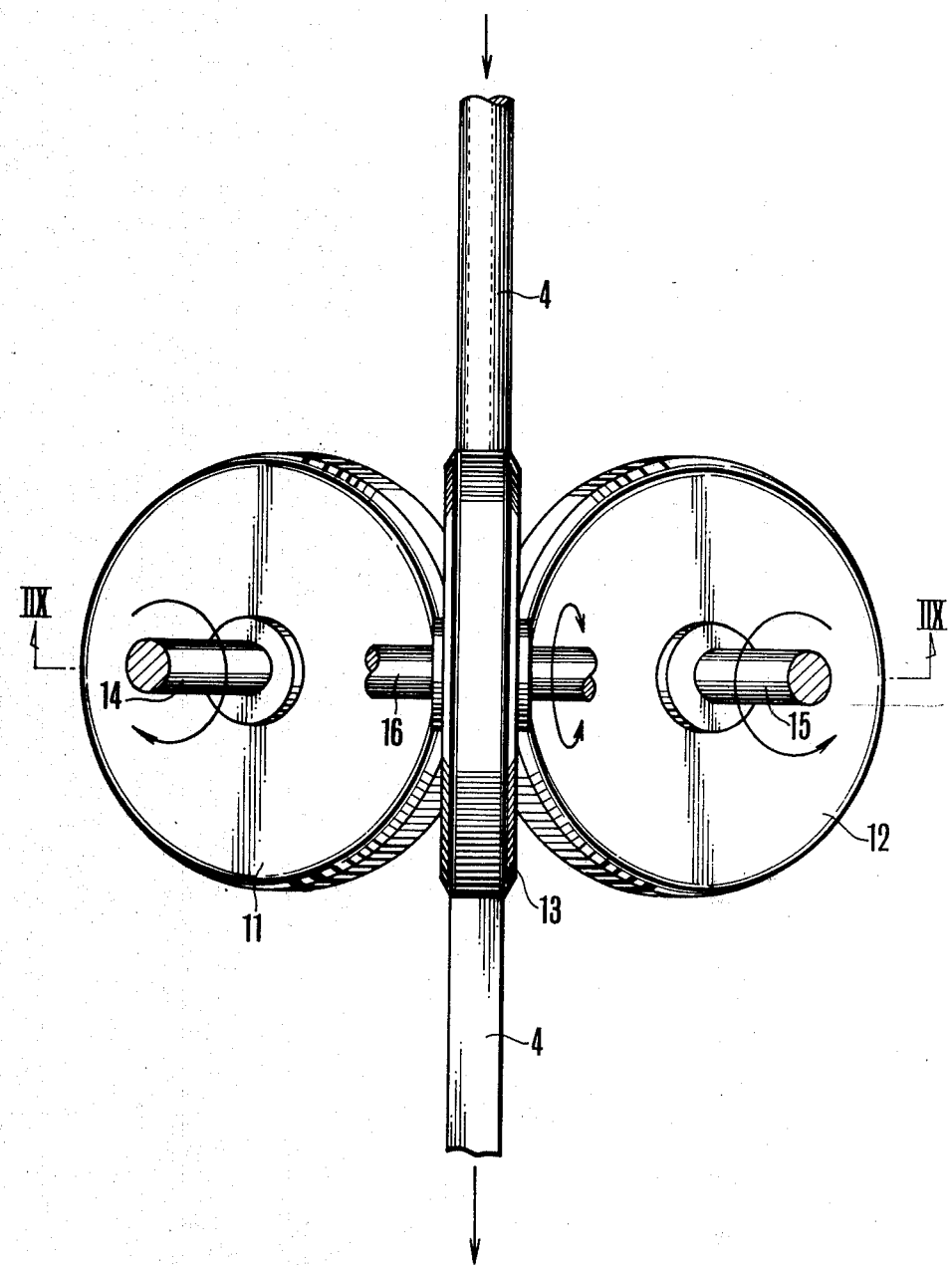
FIG. 6 is a schematic view of an apparatus for forming a transferring tube according to this invention.
Figure 7:
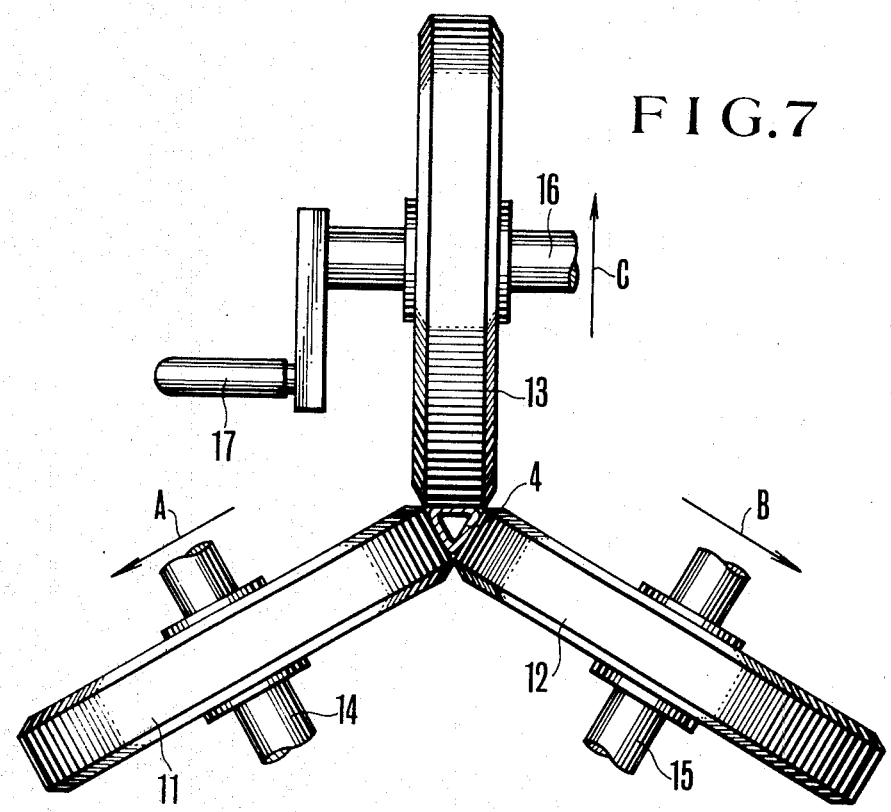
FIG. 7 is a front view of the apparatus of FIG. 6.
Figure 8:
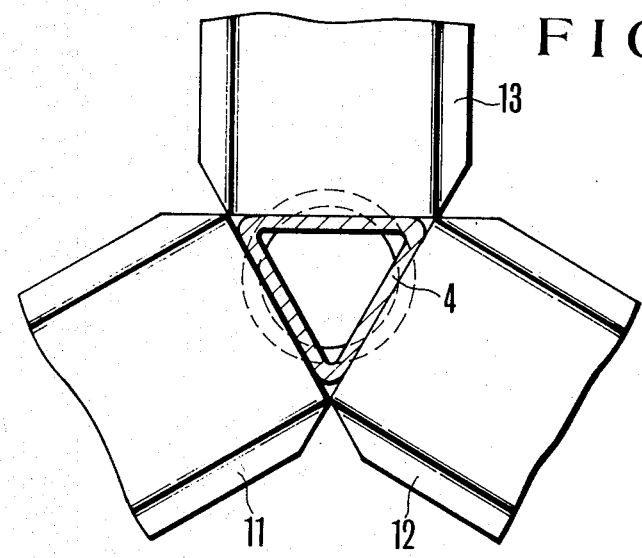
FIG. 8 is an enlarged fragmentary view showing details of a portion of FIG. 7.

Referring now to FIGS. 6–8, it will be seen that an apparatus for deforming a circular tube, such as shown in the upper part of FIG. 6, into a triangular transferring tube 4 as shown in the lower part of FIG. 6, includes first, second and third discs 11, 12 and 13 rotatably supported on shafts 14, 15 and 16, respectively. The perimeters of discs 11, 12 and 13 are mutually disposed, as best seen in FIGS. 7 and 8, to define a triangular space therebetween through which transferring tube 4 is driven. A handle 17 or other means, is provided for driving at least one of the discs, such as, for example, disc 13 to force transferring tube 4 through the triangular space defined between the perimeters of the three discs 11, 12 and 13. Shafts 14, 15 and 16 may be adjustable in the directions indicated by arrows A, B and C, respectively, to vary the size of the triangular space defined between the perimeters of the discs. The edges of the perimeters of discs 11, 12 and 13 may be beveled or chamfered, as particularly shown on FIG. 8, to permit close approach of the faces thereof.

Instead of driving only disc 13 and depending on the passage of transferring tube 4 between discs 11, 12 and 13 to rotate the other two discs 11 and 12, as on FIG. 7, two or all three discs may be driven using, for example, bevel gears (not shown) joining shafts 14, 15 and 16 for concerted rotation thereof.

As best seen in FIG. 8, the original circular cross section of transferring tube 4, shown in dashed line, is deformed into a triangular shape, as shown in solid line. Proper choice of material for transferring tube 4 permits the deformation thus produced to be permanent. Such permanent deformation may be aided by temperature or other environmental control before, during and after the deformation.

Referring now to FIGS. 9–12, it will be seen that a connecting pipe 20 is provided for making a transition from each triangular transferring tube 4 to the respective relatively precise locating hole 21 extending through positioning plate 5. A counterbored receiving recess 22 is formed in the upper portion of each hole 21, and connecting pipe 20 has a circular bore substantially matching the diameter of through hole 21 and is inserted into receiving recess 22 to bear against the shoulder formed by the lower end of counterbored recess 22. A tapered portion 23 forms a transition from the relatively large cross-section of transferring tube 4 to the relatively smaller cross-section of connecting pipe 20 which is dimensioned to closely receive circuit element 1. A circular large-diameter portion 25 is joined to the upper end of tapered portion 23. An annular shoulder 24 is formed at the junction of tapered portion 23 and large diameter portion 25 to provide a positioning stop for the lower end of transferring tube 4. It will be noted that the thickness of the material of transferring tube 4 exceeds the width of shoulder 24 to avoid interference with the smooth movement of circuit elements from transferring tube 4 into connecting pipe 20.

As best seen in FIG. 12, connecting pipe 20, tapered portion 23 and large diameter portion 25 have circular cross sections whereas the main portion of transferring tube 4 has a triangular cross section in accordance with this invention. When the end of transferring tube 4 is inserted into large diameter portion 25, the end portion of tube 4 is deformed from its triangular cross section (FIG. 10) into a circular cross section to match the shape of large diameter portion 25 (FIG. 11). This provides a smooth transition for circuit elements passing therethrough.

At least connecting pipe 20 is of a ductile material, such as, for example, copper, to permit bending thereof as required to fit individual receiving recesses 22. Since connecting pipes 20 have diameters not much larger than the diameters of the circuit elements which pass therethrough, through holes 21 in positioning plate 5 can be densely positioned for disposing the circuit elements in the template quite close together. Connecting pipes 20, being of ductile material such as copper, may be curved as required to provide space for the large diameter upper end portions 25 while the lower ends of pipes 20 are close to each other in plate 5.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claim.

What is claimed is:

1. An apparatus for transferring cylindrical parts from a first location to a second location, comprising:
    a transferring tube of triangular cross-section having first and second ends;
    means at said first location for feeding said cylindrical parts into said first end; and
    means at said second location for receiving said cylindrical parts from said second end, including a connecting pipe having a large diameter portion of circular cross-section receiving said second end of the transferring tube and deforming said second end into a circular cross-section.

* * * * *